United States Patent
Nurani et al.

(10) Patent No.: US 10,686,461 B1
(45) Date of Patent: Jun. 16, 2020

(54) TOP PLATE SAMPLING ANALOG-TO-DIGITAL CONVERTER (ADC) WITH RESIDUE AMPLIFIER NON-LINEARITY REDUCTION

(71) Applicant: TEXAS INSTRUMENTS INCORPORATED, Dallas, TX (US)

(72) Inventors: Sai Aditya KrishnaSwamy Nurani, Hyderabad (IN); Arun Mohan, Bengaluru (IN); Shagun Dusad, Bengaluru (IN); Neeraj Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/234,685

(22) Filed: Dec. 28, 2018

(51) Int. Cl.
| | |
|---|---|
| *H03M 1/06* | (2006.01) |
| *H03F 1/32* | (2006.01) |
| *H03F 3/45* | (2006.01) |
| *H04B 1/38* | (2015.01) |

(52) U.S. Cl.
CPC ........ *H03M 1/0612* (2013.01); *H03F 1/3205* (2013.01); *H03F 3/45183* (2013.01); *H03F 2203/45156* (2013.01); *H04B 1/38* (2013.01)

(58) Field of Classification Search
CPC ............. H03M 1/0612; H03M 1/0636; H03M 1/0682; H03F 3/45183
USPC .......................................... 341/144, 155, 118
See application file for complete search history.

(56) References Cited

U.S. PATENT DOCUMENTS 5,847,600 A * 12/1998 Brooks ................... H03F 3/005
330/9

* cited by examiner

*Primary Examiner* — Peguy Jean Pierre
(74) *Attorney, Agent, or Firm* — John R. Pessetto; Charles A. Brill; Frank D. Cimino (57) ABSTRACT

A top-plate sampling analog-to-digital converter (ADC) circuit includes a first ADC stage and a residue amplifier coupled to the first ADC stage. The residue amplifier comprises a first transistor with a control terminal, a first current terminal, and a second current terminal. The residue amplifier also comprises a second transistor with a control terminal, a first current terminal, and a second current terminal. The residue amplifier also comprises a linearity adjustment circuit coupled to a second current terminal of at least one of the first transistor and the second transistor. The linearity adjustment circuit comprises at least one switch that changes its state as a function of an input sampling phase and a gain phase of the residue amplifier.

16 Claims, 7 Drawing Sheets

TOP PLATE SAMPLING ANALOG-TO-DIGITAL CONVERTER (ADC) WITH RESIDUE AMPLIFIER NON-LINEARITY REDUCTION

BACKGROUND

Many modern electronic systems involve analog-to-digital converters (ADCs) and/or digital-to-analog converters (DACs). One example ADC topology is referred to as top plate sampling ADC topology. In a top plate sampling ADC topology, an input signal is sampled using a capacitor having a first node coupled to a sampling switch and a second node coupled to ground. In a top plate sampling ADC topology, the front-end circuitry (e.g., a flash stage) receives a full input and provides a multi-bit output that is fed to a multi-bit DAC. The analog output of the DAC is subtracted from the ADC input, and the "residue" of the subtraction is then gained up and is fed to the next stage. In an ADC, non-linearity in the residue stage and/or other stages reduces the accuracy of an ADC.

SUMMARY

In accordance with at least one example of the disclosure, a top-plate sampling analog-to-digital converter (ADC) circuit comprises a first ADC stage and a residue amplifier coupled to the first ADC stage. The residue amplifier comprises a first transistor with a control terminal, a first current terminal, and a second current terminal. The residue amplifier also comprises a second transistor with a control terminal, a first current terminal, and a second current terminal. The residue amplifier also comprises a linearity adjustment circuit coupled to a second current terminal of at least one of the first transistor and the second transistor, wherein the linearity adjustment circuit comprises at least one switch that changes its state as a function of an input sampling phase and a gain phase of the residue amplifier.

In accordance with at least one example of the disclosure, a system comprises a top-plate sampling capacitor and an ADC circuit. The ADC circuit comprises a first ADC stage and a residue amplifier coupled to the first ADC stage. The residue amplifier comprises a differential pair of transistors. The differential pair of transistors comprises a first transistor with a control terminal, a first current terminal, and a second current terminal. The differential pair of transistors also comprises a second transistor with a control terminal, a first current terminal, and a second current terminal. The residue amplifier also comprises a linearity adjustment circuit coupled to the differential pair of transistors and configured to bias the differential pair of transistors in a depletion region during an input sampling phase of the residue amplifier.

In accordance with at least one example of the disclosure, an integrated circuit comprises a top-plate sampling input node. The integrated circuit also comprises an ADC circuit coupled to the top-plate sampling input node. The ADC circuit comprises a first ADC stage and a residue amplifier coupled to the first ADC stage. The residue amplifier comprises a differential pair of transistors. The differential pair of transistors comprises a first transistor with a control terminal, a first current terminal, and a second current terminal. The differential pair of transistors also comprises a second transistor with a control terminal, a first current terminal, and a second current terminal. The residue amplifier also comprises a linearity adjustment circuit coupled to the differential pair of transistors and configured to operate the first and second transistors in a source follower mode during an input sampling phase of the residue amplifier.

BRIEF DESCRIPTION OF THE DRAWINGS

For a detailed description of various examples, reference will now be made to the accompanying drawings in which.

DETAILED DESCRIPTION

Disclosed herein are top plate sampling analog-to-digital converter (ADC) devices, systems, and methods, involving a residue amplifier with differential transistors and a linearity adjustment circuit. In accordance with at least one example of the disclosure, a top-plate sampling ADC circuit comprises a first ADC stage and a residue amplifier coupled to the first ADC stage. The residue amplifier comprises a first transistor with a control terminal, a first current terminal, and a second current terminal. The residue amplifier also comprises a second transistor with a control terminal, a first current terminal, and a second current terminal. The residue amplifier also comprises a linearity adjustment circuit coupled to a second current terminal of at least one of the first transistor and the second transistor, wherein the linearity adjustment circuit comprises at least one switch that changes its state as a function of an input sampling phase and a gain phase of the residue amplifier. With the linearity adjustment circuit, ADC error resulting from operations of the residue amplifier are reduced compared to other ADC topologies. To provide a better understanding, various options for top plate sampling ADC devices, systems, and methods involving a residue amplifier with differential transistors and a linearity adjustment circuit are described using the figures as follows.

Figure 1:
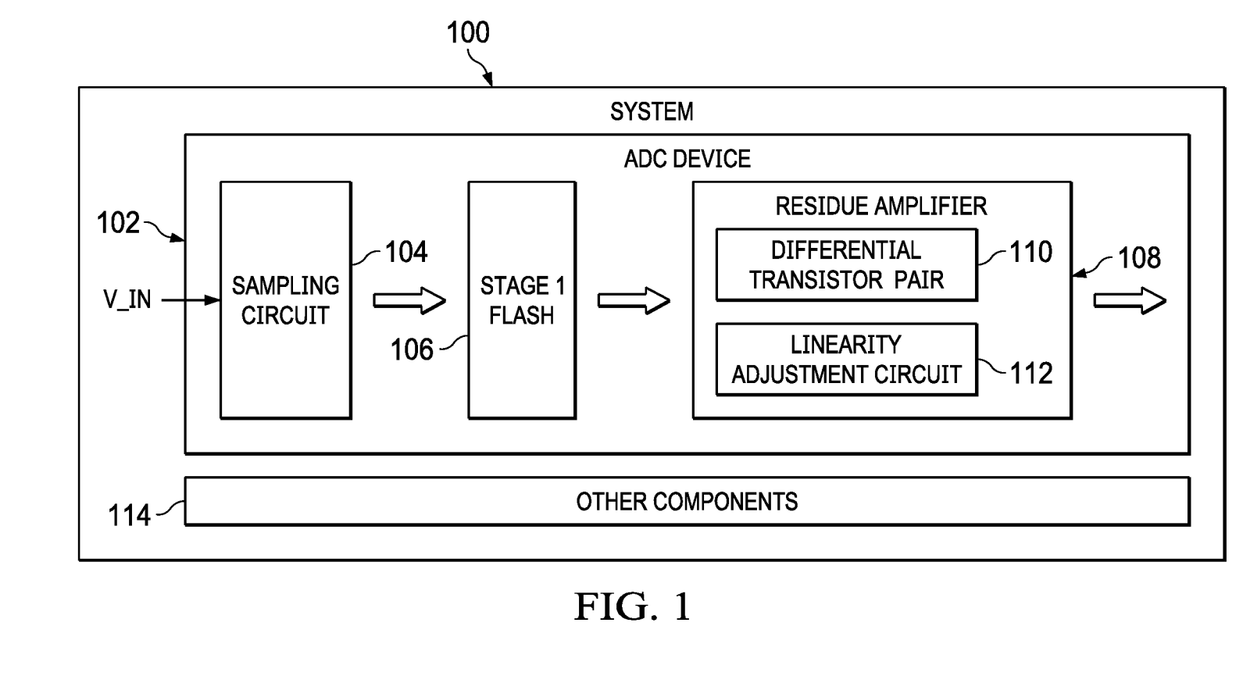
FIG. 1 is a block diagram of a system with an analog-to-digital converter (ADC) device in accordance with various examples.

FIG. 1 is a block diagram of a system 100 with an ADC device 102 in accordance with various examples. In FIG. 1, the system 100 represents an electrical system or consumer device that converts analog signals to digital signals using the ADC device 102. In different examples, the system 100 also includes other comprises other components 114 such as digital components, digital signal processors (DSPs), digital-to-analog converters (DACs) processors, and/or memory devices.

In FIG. 1, the ADC device 102 corresponds to an integrated circuit, a chip, a multi-die module, or a combination of integrated circuit components and discrete components. As shown, the ADC device 102 includes a sampling circuit 104 configured to sample an input signal (V_IN). In some examples, the sampling circuit 104 has a top plate sampling topology (a capacitor with a top plate that stores a charge based on V_IN and with a bottom plate coupled to a ground node). The ADC device 102 also includes a stage 1 flash 106 that provides a digital code based on the magnitude of V_IN provided by the sampling circuit 104. The output of the stage 1 flash 106 is fed to DAC, and the analog output is subtracted from V_IN. This "residue" is then amplified by a residue stage that includes the residue amplifier 108.

In the example of FIG. 1, the residue amplifier 108 includes a differential transistor pair 110 and a linearity adjustment circuit 112. In some examples, the linearity adjustment circuit 112 is coupled to a second current terminal of at least one of the transistors of the differential transistor pair 110. To perform linearity adjustments operations, the linearity adjustment circuit 112 comprises at least one switch that changes its state as a function of an input sampling phase and a gain phase of the residue amplifier 108. With the linearity adjustment circuit 112, ADC error resulting from operations of the residue amplifier 108 are reduced compared to other ADC topologies.

Figure 2:
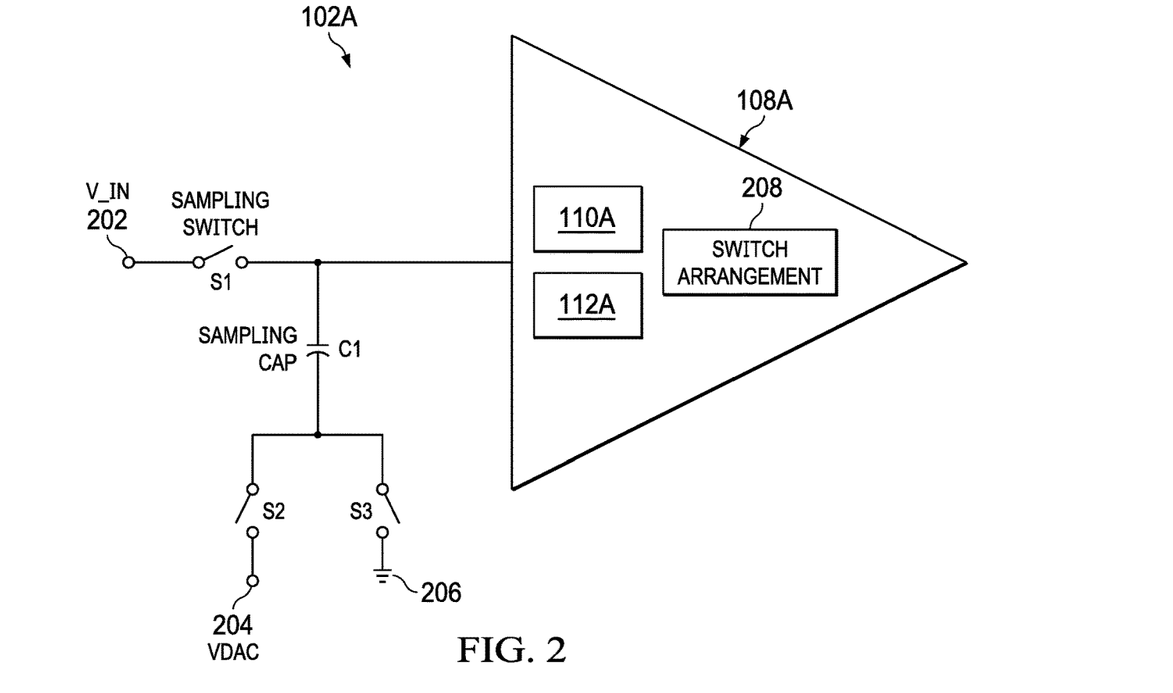
FIG. 2 is a schematic diagram of an ADC device in accordance with various examples.

FIG. 2 is a schematic diagram of an ADC device 102A (an example of the ADC device 102 in FIG. 1) in accordance with various examples. As shown, the ADC device 102A includes a sampling switch, S1, where S1 is coupled between an input node 202 (to receive V_IN) and the top plate of a sampling capacitor, C1. The bottom plate of C1 is coupled to a VDAC node 204 (to receive a DAC output) via a switch, S2. The bottom plate of C1 is also coupled to a ground node 206 via another switch, S3. During an input sampling phase of the ADC device 102, S1 and S3 are closed, and S2 is open. During a gain phase of the ADC device 102A, S1 and S3 are open, and S2 is closed.

As shown in FIG. 2, the ADC device 102A also includes a residue amplifier 108A (an example of the residue amplifier 108 of FIG. 1). The residue amplifier 108A includes a differential transistor pair 110A (an example of the differential transistor pair 110 in FIG. 1) and a linearity adjustment circuit 112A (an example of the linearity adjustment circuit 112 in FIG. 1). In some examples, the linearity adjustment circuit 112A is coupled to a second current terminal of at least one of the transistors of the differential transistor pair 110A. To perform linearity adjustments operations, the linearity adjustment circuit 112A comprises a switch arrangement 208 with at least one switch that changes its state as a function of the input sampling phase and the gain phase of the ADC device 102A or residue amplifier 108A. With the linearity adjustment circuit 112A, ADC error resulting from operations of the residue amplifier 108A are reduced compared to other ADC topologies.

Figure 3A:
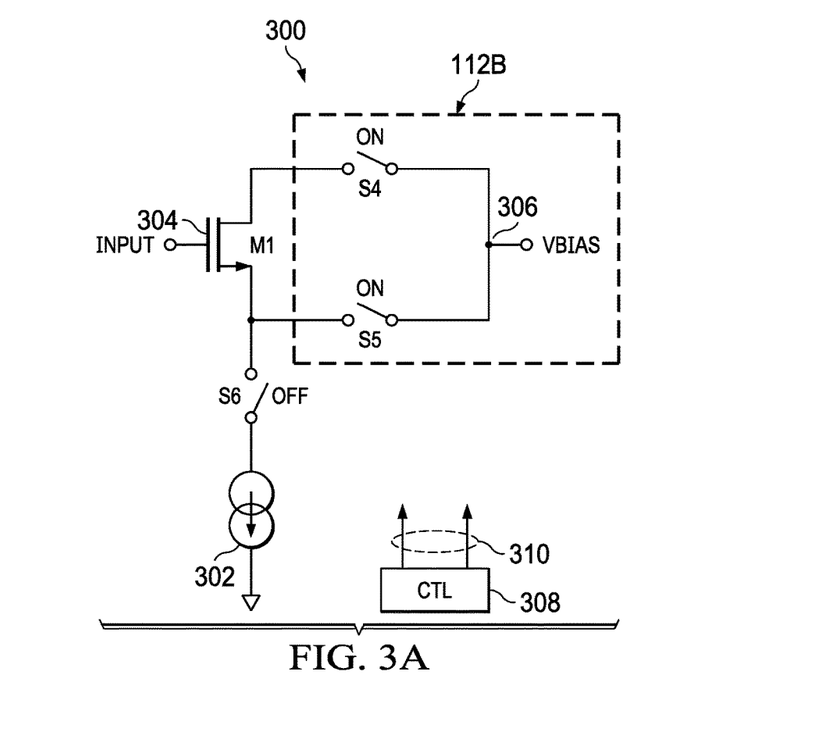
FIG. 3A is a schematic diagram showing a residue amplifier scenario with a linearity adjustment circuit in accordance with various examples.

FIG. 3A is a schematic diagram showing a residue amplifier scenario 300 with a linearity adjustment circuit 112B in accordance with various examples. In the residue amplifier scenario 300, a residue amplifier transistor (M1) has its control terminal coupled to an input node 304, where the signal at the input node 304 depends on whether an ADC device related to the residue amplifier scenario 300 is in an input sampling phase or a gain phase. Meanwhile, the first current terminal of M1 is coupled to a VBIAS node 306 via a switch, S4. Also, the second current terminal of M1 is coupled to the VBIAS node 306 via another switch, S5. In the residue amplifier scenario 300, S4 and S5 are an example of the switch arrangement 208 of FIG. 2. As shown, the second current terminal of M1 also is coupled to a bias current source 302 via a switch, S6.

In the example of FIG. 3A, a controller 308 provides control signals 310 to the switches S4, S5, and S6. More specifically, during a gain phase of a related ADC, the control signals 310 direct S4 and S5 to open, and direct S6 to close. During an input sampling phase of a related ADC, the control signals 310 direct S4 and S5 to close, and direct S6 to open.

Figure 3B:
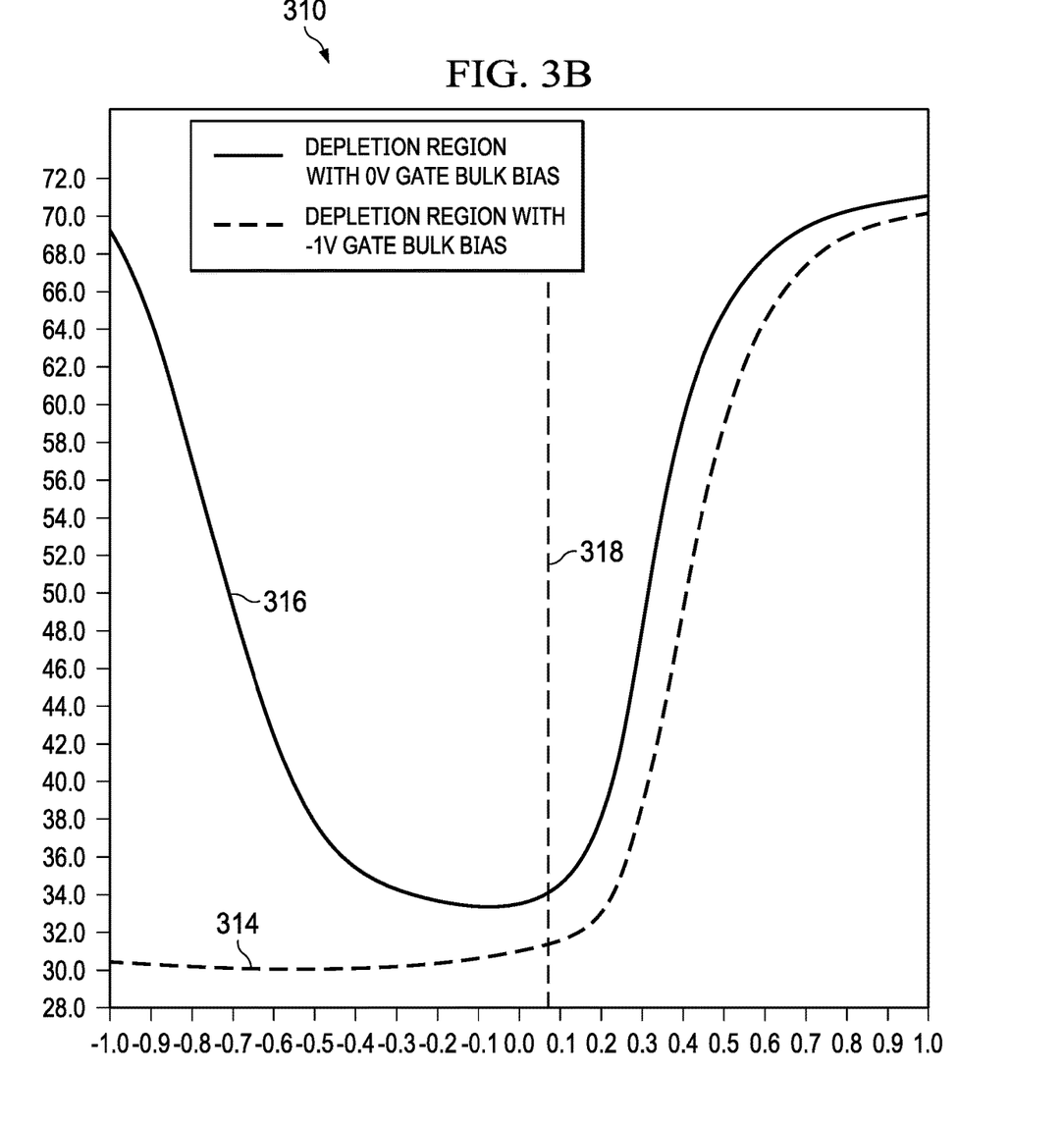
FIG. 3B is a graph showing depletion regions of a residue amplifier transistor as a function of linearity adjustment circuit operations in accordance with various examples.

FIG. 3B is a graph 310 showing depletion regions of a residue amplifier transistor (e.g., M1 in FIG. 3A) as a function of linearity adjustment circuit operations in accordance with various examples. As shown in FIG. 3B, graph 310 shows a depletion region 316 for the residue amplifier transistor with a 0V gate-bulk bias. Graph 310 also shows a depletion region 314 for the residue amplifier transistor with a −1V gate-bulk bias. As shown, below a threshold 318, the linearity of the depletion region 314 is improved relative to the depletion region 316. Accordingly, one strategy employed by a linearity adjustment circuit such as the linearity adjustment circuit 112B is to adjust the gate-bulk bias (e.g., from 0V to −1V) to improve linearity of a respective transistor (e.g., M1 in FIG. 3A) during the input sampling phase of a related ADC.

Figure 4A:
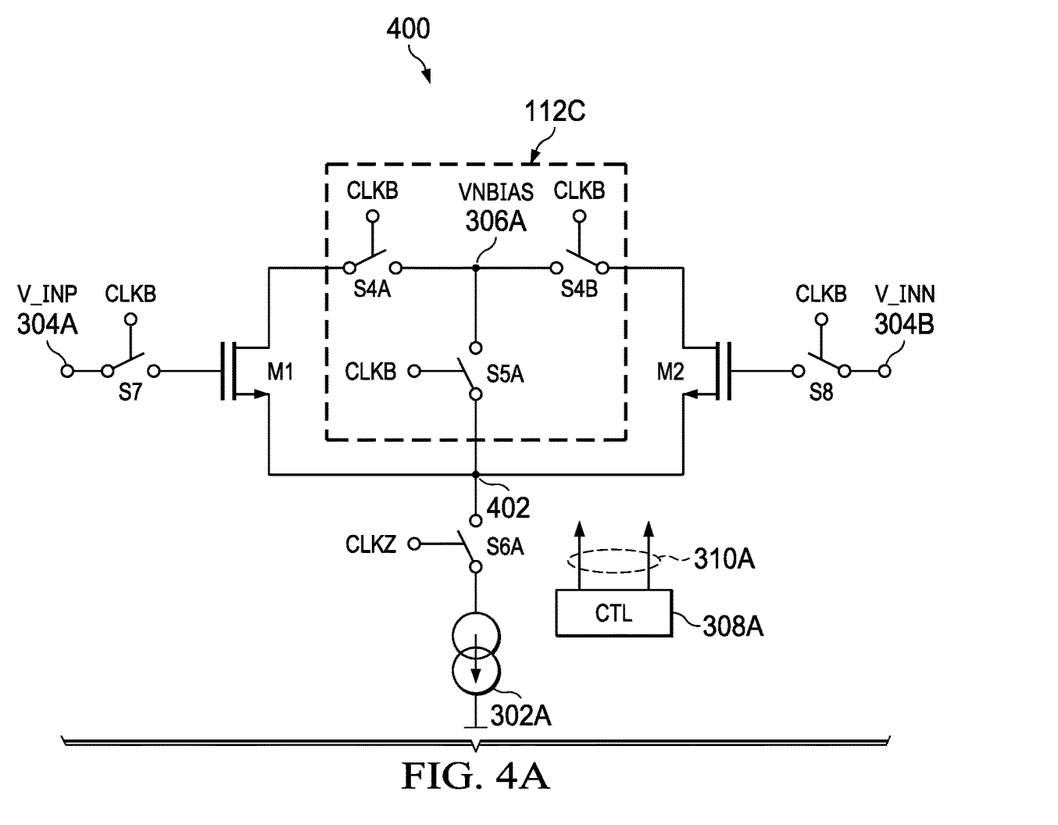
FIG. 4A is a schematic diagram showing a residue amplifier scenario with a linearity adjustment circuit in accordance with various examples.

FIG. 4A is a schematic diagram showing a residue amplifier scenario 400 with a linearity adjustment circuit 112C in accordance with various examples. For the residue amplifier scenario 400, the gate-bulk bias for each transistor of a differential pair of transistors, M1 and M2, is adjusted to improve linearity as described in FIG. 3B. More specifically, M1 comprises a control terminal coupled to an V_INP input node 304A (an example of the input node 304 in FIG. 3A) via a switch S7, where the signal at the input node 304A depends on whether an ADC device related to the residue amplifier scenario 400 is in an input sampling phase or a gain phase. Also, M2 comprises a control terminal coupled to an V_INN input node 304B (an example of the input node 304 in FIG. 3A) via a switch S8, where the signal at the input node 304B depends on whether an ADC device related to the residue amplifier scenario 400 is in an input sampling phase or a gain phase.

In the residue amplifier scenario 400, the linearity adjustment circuit 112C comprises switches S4A, S4B, and S5A. More specifically, S4A (an example of S4 in FIG. 3) is coupled between a VNBIAS node 306A (an example of the VBIAS node 306 in FIG. 3) and a first current node of M1. Also, S4B (an example of S4 in FIG. 3) is coupled between the VNBIAS node 306A and a first current node of M2. Also, S5A (an example of S5 in FIG. 3) is coupled between the VNBIAS node 306A and a tail node 402 coupled to the second current terminal of M1 and to the second current terminal of M2. As shown in FIG. 4A, the tail node 402 is coupled to a bias current source 302A (an example of the bias current source 302 in FIG. 3) via a switch, S6A (an example of the switch S6 in FIG. 3).

Figure 4B:
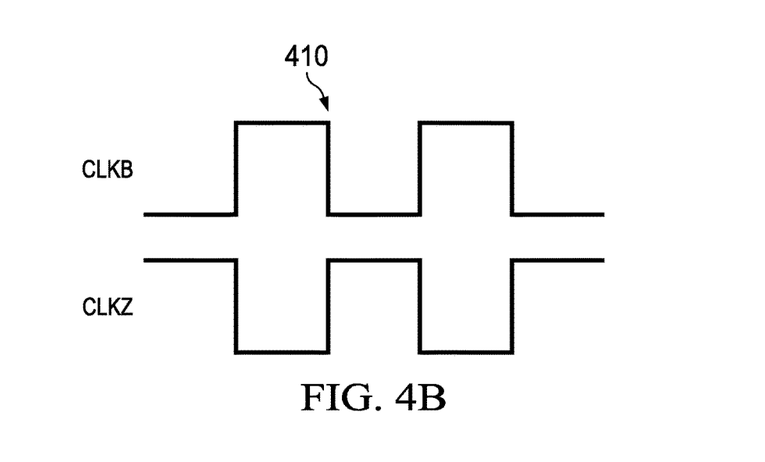
FIG. 4B is a schematic diagram showing a linearity adjustment circuit for a residue amplifier in accordance with various examples.

In the residue amplifier scenario 400, the various switches (S4A, S4B, S5, S6A, S7, and S8) are controlled by control signals CLKB and CLKZ. More specifically, S4A, S4B, S5, and S7, and S8 are controlled by CLKB, while S6A is controlled by CLKZ. Examples of CLKB and CLKZ are given in FIG. 4B, where CLKZ is the inverse of CLKB (when CLKB is high, CLKZ is low; and when CLKB is low, CLKZ is high). In the residue amplifier scenario 400, S4A, S4B, and S5A of the linearity adjustment circuit 112C are used to bias the transistors in depletion region to improve linearity of M1 and M2 during the input sampling phase of a related ADC device. In the example of FIG. 4A, a controller 308A (an example of the controller 308 in FIG. 3A) provides control signals 310A (an example of the control signals 310 in FIG. 3A) such as CLKB and CLKZ. More specifically, during an input sampling phase of a related ADC, CLKB directs S4A, S4B, and S5A to close, while CLKZ directs S6A to open. During a gain phase of a related ADC, the CLKB directs S4A, S4B, and S5A to open, while CLKZ directs S6A to close. With the linearity adjustment circuit 112C, ADC error resulting from operations of the residue amplifier scenario 400 are reduced compared to other ADC topologies.

Figure 5:
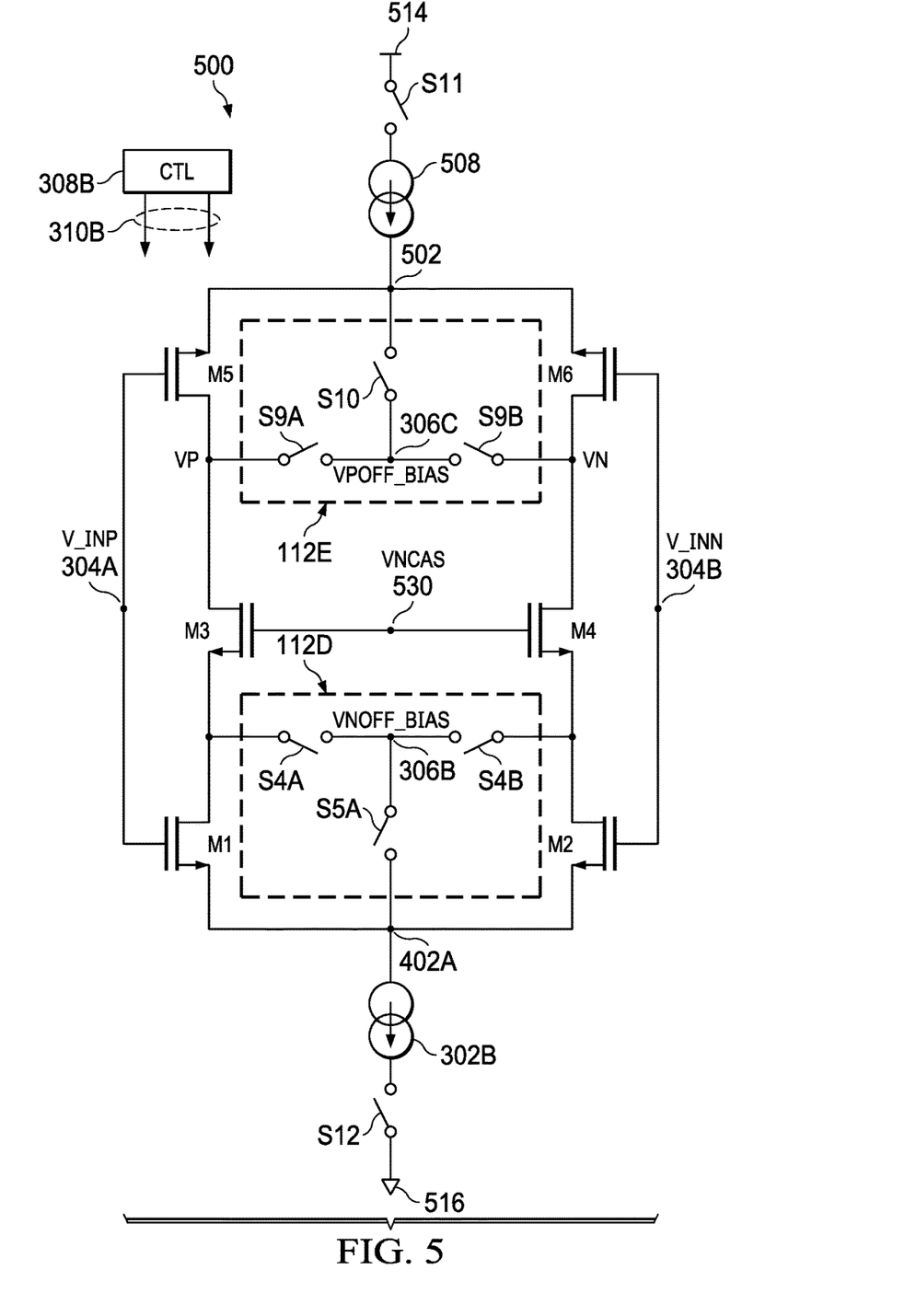
FIG. 5 is a schematic diagram of a residue amplifier circuit with a linearity adjustment circuit in accordance with various examples.

FIG. 5 is a schematic diagram of a residue amplifier circuit 500 with a linearity adjustment circuit 112D in accordance with various examples. In the residue amplifier circuit 500, the linearity adjustment circuit 112D is configured to bias each transistor of a first differential pair of transistors, M1 and M2 in depletion region such that the voltage difference between gate and source and between gate and drain is negative to improve linearity as described in FIG. 3B. The linearity adjustment circuit 112D of FIG. 5 is also configured to bias each transistor of a second differential pair of transistors, M5 and M6 in depletion region such that the voltage different between gate and source and between gate and drain are negative to improve linearity as described in FIG. 3B. As shown, the control terminals for M1 and M5 are coupled to a V_INP node 304A (an example of the V_INP node 304A in FIG. 4A). Also, the control terminals for M2 and M6 are coupled to a V_INN node 304B (an example of the V_INN node 304B in FIG. 4A).

More specifically, the linearity adjustment circuit 112D includes the switches S4A, S4B, and S5A arranged as described for FIG. 4, where S4A is between a VNOFF_BIAS node 306B (an example of the VBIAS node 306 in FIG. 3A, or the VNBIAS node 306A in FIG. 4A) and the first current terminal of M1. Also, S4B is between the VNOFF_BIAS node 306B and the first current terminal of M2. Also, S5A is between the VNOFF_BIAS node 306B and a tail node 402A (an example of the tail node 402 in FIG. 4A), where the tail node is coupled to the second current terminal of M1, to the second current terminal of M2, and to a bias current source 302B (an example of the bias current source 302 in FIG. 3A, and the bias current source 302A in FIG. 4A). As shown, a switch, S12, is between the bias current source 302B and a ground node 516.

In the example of FIG. 5, the linearity adjustment circuit 112D also includes switches S9A, S9B, and S10, where S9A is between a VPOFF_BIAS node 306C and a second current terminal of M5. Also, S9B is between the VPOFF_BIAS node 306C and a second current terminal of M6. Also, S10 is between the VPOFF_BIAS node 306C and a node 502, where the node is coupled to a first current terminal of M5, to a first current terminal of M6, and to a bias current source 508. As shown, a switch, S11, is between the bias current source 508 and a power supply node 514.

In the example of FIG. 5, the residue amplifier circuit 500 also includes a transistor (M3) with a control terminal, a first current terminal, and second current terminal, where the control terminal of M3 is coupled to a VNCAS node 530, the first current of M3 is coupled to the second current terminal of M5, and the second current terminal of M3 is coupled to the first current terminal of M1. In the example of FIG. 5, the residue amplifier circuit 500 also includes a transistor (M4) with a control terminal, a first current terminal, and second current terminal, where the control terminal of M4 is coupled to the VNCAS node 530, the first current of M4 is coupled to the second current terminal of M6, and the second current terminal of M4 is coupled to the first current terminal of M2. VNCAS is used to bias the transistors M3 and M4 in cascode configuration. With the linearity adjustment circuit 112D, ADC error resulting from operations of the residue amplifier 500 are reduced compared to other ADC topologies. In the example of FIG. 5, a controller 308B (an example of the controller 308 in FIG. 3A, or the controller 308A in FIG. 4A) provides control signals 310B (an example of the control signals 310 in FIG. 3A, or the control signals 310A in FIG. 4A) More specifically, during an input sampling phase of a related ADC, the control signals 310B direct S4A, S4B, S5A, S9A, S9B, and S10 to be closed, while S11 and S12 are directed to be open. In contrast, during gain phase of a related ADC, the control signals 310N direct S4A, S4B, S5A, S9A, S9B, and S10 to be open, while S11 and S12 are directed to be closed.

In some examples, a top-plate sampling ADC device, circuit, or integrated circuit (e.g., the ADC device 102 of FIG. 1, or the ADC device 102A of FIG. 2) comprises a first ADC stage (e.g., stage 1 flash 106 in FIG. 1) and a residue amplifier (e.g., the residue amplifier 108 in FIG. 1, the residue amplifier 108A in FIG. 2, at least some of the components from the residue amplifier scenario 300 in FIG. 3A, at least some of the components from the residue amplifier scenario 400 in FIG. 4, or the residue amplifier circuit 500 in FIG. 5) coupled to the first ADC stage. In some examples, the residue amplifier comprises a first transistor (e.g., M1 in FIGS. 3A, 4A, and 5) with a control terminal, a first current terminal, and a second current terminal. The residue amplifier comprises a second transistor (e.g., M2 in FIGS. 4A and 5) with a control terminal, a first current terminal, and a second current terminal. The residue amplifier also comprises a linearity adjustment circuit (e.g., the linearity adjustment circuit 112 in FIG. 1, the linearity adjustment circuit 112A in FIG. 2, the linearity adjustment circuit 112B in FIG. 3A, the linearity adjustment circuit 112C in FIG. 4A, or the linearity adjustment circuit 112D in FIG. 5) coupled to a second current terminal of at least one of the first transistor and the second transistor, wherein the linearity adjustment circuit comprises at least one switch (e.g., the switch arrangement 208 in FIG. 2; S4 and S5 in FIG. 3A; S4A, S4B, and S5A in FIG. 4A; or S4A, S4B, S5A, S9A, S9B, or S10 in FIG. 5) that changes its state as a function of an input sampling phase and a gain phase of the residue amplifier.

In some examples, the at least one switch of a linearity adjustment circuit includes a first switch (e.g., S5 in FIG. 3A, S5A in FIG. 4A, S5A in FIG. 5) coupled between the second current terminal of the first transistor (e.g., M1) and a bias voltage node (e.g., node 306 in FIG. 3A, node 306A in FIG. 4A, and node 306B in FIG. 5). In some examples, the at least one switch of the linearity adjustment circuit also includes a second switch (e.g., S4 in FIG. 3A, S4A in FIG. 4A, S4A in FIG. 5) coupled between the first current terminal of the first transistor (e.g., M1) and the bias voltage node (e.g., node 306 in FIG. 3A, node 306A in FIG. 4A, and node 306B in FIG. 5). In some examples, the at least one switch of the linearity adjustment circuit also includes a third switch (e.g., S4B in FIG. 4A, S4B in FIG. 5) coupled between the first current terminal of second transistor (e.g., M2) and the bias voltage node (e.g., node 306A in FIG. 4A, and node 306B in FIG. 5).

In some examples, a top-plate sampling ADC device, circuit, or integrated circuit comprises a controller (e.g., the controller 308 in FIG. 3A, the controller 308A in FIG. 4A, or the controller 308B in FIG. 5) is coupled to control terminals of the first and second switches (e.g., S4 and S5 in FIG. 3A, S4A and S5A in FIG. 4A, or S4A and S5A in FIG. 5) of the linearity adjustment circuit. During the input sampling phase of the residue amplifier, the controller is configured to turn on the first and second switches to apply a bias voltage across the first and second current terminals of the first transistor to maintain the first transistor in a depletion region. If a third switch (e.g., S4B in FIGS. 4A and 5) is used, the controller is configured to turn on the third switch to apply a bias voltage across the first and second current terminals of a second transistor to maintain the second transistor in a depletion region.

Figure 6A:
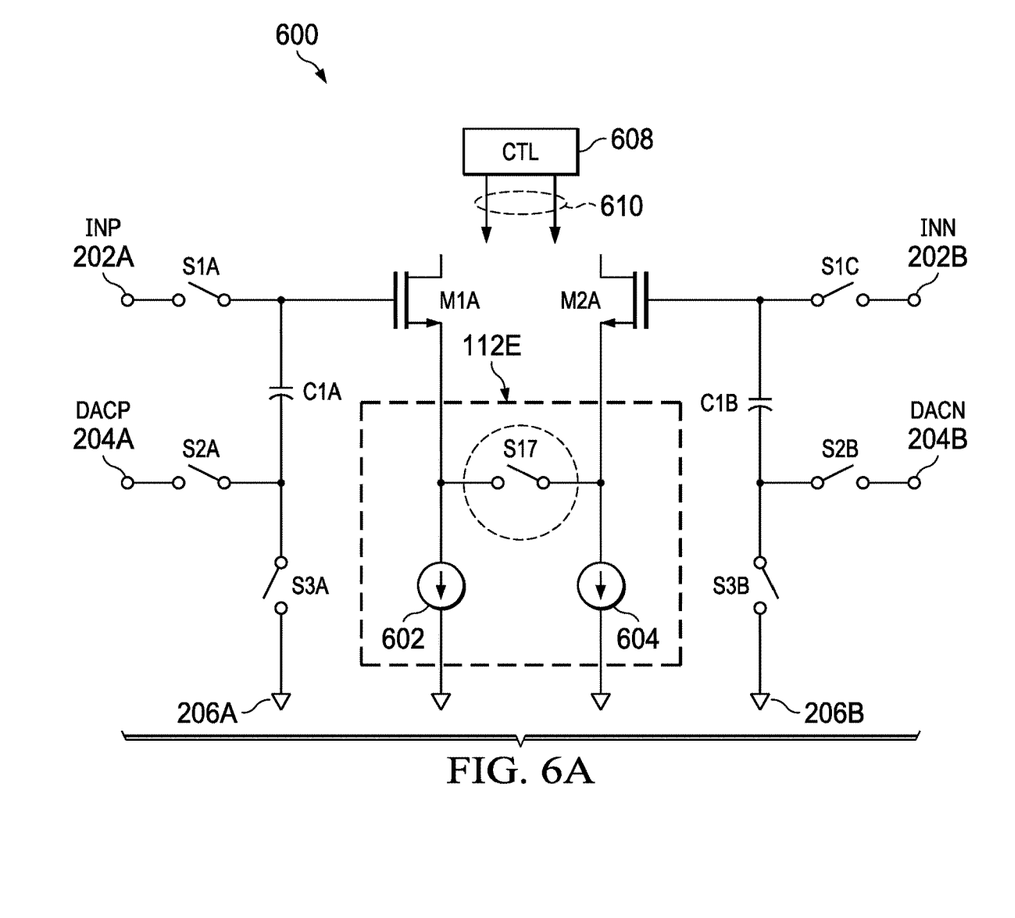
FIG. 6A is a schematic diagram of another residue amplifier scenario with a linearity adjustment circuit in accordance with various examples.

FIG. 6A is a schematic diagram of another residue amplifier scenario 600 with a linearity adjustment circuit 112E (an example of the linearity adjustment circuit 112 in FIG. 1, or the linearity adjustment circuit 112A in FIG. 2) in accordance with various examples. In the residue amplifier scenario 600, a pair of differential transistors, M1A and M2A, are represented, each having a control terminal, a first current terminal, and a second current terminal. More specifically, the control terminal of M1A is coupled to the top plate of a sampling capacitor, C1A (an example of C1 in FIG. 2), where the top plate of C1A is also coupled to an input node 202A (an example of node 202 in FIG. 2) via a sampling switch, S1A (an example of the S1 in FIG. 2). The bottom plate of C1A is coupled to a ground node 206A (an example of the ground node 206 in FIG. 2) via a switch, S3A (an example of the switch S3 in FIG. 2). The bottom plate of C1A is also coupled to a DACP node 204A (an example of the VDAC node 204 in FIG. 2) via a switch, S2A (an example of the switch S2 in FIG. 2). The first current terminal of M1A is coupled to the output load either directly or via a folding branch.

Also, the control terminal of M2A is coupled to the top plate of a sampling capacitor, C1B (an example of C1 in FIG. 2), where the top plate of C1B is also coupled to an input node 202B (an example of node 202 in FIG. 2) via a sampling switch, S1B (an example of the S1 in FIG. 2). The bottom plate of C1B is coupled to a ground node 206B (an example of the ground node 206 in FIG. 2) via a switch, S3B (an example of the switch S3 in FIG. 2). The bottom plate of C1B is also coupled to a DACN node 204A (an example of the VDAC node 204 in FIG. 2) via a switch, S2B (an example of the switch S2 in FIG. 2). The first current terminal of M2A is coupled to the output load either directly or via a folding branch.

The linearity adjustment circuit 112E of FIG. 6A is coupled to the second current terminals of M1A and M2A. More specifically, the second current terminal of M1A couples to a first bias current source 602. Meanwhile, the second current terminal of M1B couples to a second bias current source 602. In the example of FIG. 6A, the linearity adjustment circuit 112E includes a switch, S17, between the second current terminals of M1A and M2A.

As shown, the residue amplifier scenario 600 also includes a controller 608 configured to provide control signals 610 to direct the various switches (e.g., S1A, S1B, S2A, S2B, S3A, S3B, and S17) during an input sampling phase and a gain phase of a related ADC. More specifically, during an input sampling phase, the control signals 610 direct S1A, S1B, S3A, and S3B to close, direct S2A and S2B to open, and direct S17 to open. During a gain phase, the control signals 610 direct S1A, S1B, S3A, and S3B to open, direct S2A and S2B to close, and direct S17 to close.

Figure 6B:
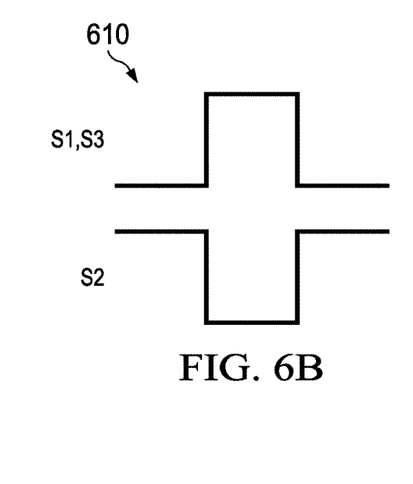
FIG. 6B is a timing diagram of control signals for the residue amplifier scenario of FIG. 6A in accordance with various examples.

FIG. 6B is a timing diagram of control signals for the linearity adjustment circuit 600 of FIG. 6A in accordance with various examples. As shown, the control signal for S1 and S3 switches (e.g., S1A, S1B, S3A, S3B) are inverse from the control signal for S2 switches (e.g., S2A and S2B). With the residue amplifier scenario 600, M1A and M2A are operated in a source follower mode, where the source tracks the gate to the first order and thus a signal is not present across the MOS capacitor, which eliminates non-linear charge. With the disclosed linearity adjustment circuits, a virtual ground switch is avoided and linearity is improved.

In at least some examples, a top-plate sampling ADC device, circuit, or integrated circuit (e.g., the ADC device 102 of FIG. 1, or the ADC device 102A of FIG. 2 comprises a first ADC stage (e.g., stage 1 flash 106 in FIG. 1) and a residue amplifier (e.g., the residue amplifier 108 in FIG. 1, the residue amplifier 108A in FIG. 2, or at least some of the components of the residue amplifier scenario 600) coupled to the first ADC stage. In some examples, the residue amplifier comprises a first transistor (e.g., M1A in FIG. 6A) with a control terminal, a first current terminal, and a second current terminal. The residue amplifier comprises a second transistor (e.g., M1A in FIG. 6A) with a control terminal, a first current terminal, and a second current terminal. The residue amplifier also comprises a linearity adjustment circuit (e.g., the linearity adjustment circuit 112 in FIG. 1, the linearity adjustment circuit 112A in FIG. 2, or the linearity adjustment circuit 112E in FIG. 6A) coupled to the differential pair of transistors and configured to operate the first and second transistors in a source follower mode during an input sampling phase of the residue amplifier.

In at least some examples, the second current terminal of the first transistor (e.g., M1A in FIG. 6A) is coupled to a first current source (e.g., the current source 602 in FIG. 6A), wherein the second current terminal of the second transistor (e.g., M2A in FIG. 6A) is coupled to a second current source (e.g., the current source 604 in FIG. 6A), and wherein the at least one switch comprises a tail switch (e.g., S17 in FIG. 6A) coupled between the second current terminals of the first and second transistors. In some examples, a top-plate sampling ADC circuit is part of an integrated circuit. In some examples, an integrated circuit comprises a transceiver that includes a top-plate sampling ADC circuits as described herein. Also, in some examples, an ADC circuit as described herein includes multiple stages, wherein each stage includes a differential pair of transistors and a linearity adjustment circuit. Also, in some examples, a top-plate sampling ADC device, circuit, or integrated comprises a controller configured to turn off the tail switch (e.g., S17 in FIG. 6A) during the input sampling phase of the residue amplifier and to turn on the tail switch during the gain phase of the residue amplifier. Also, in some examples, a top-plate sampling ADC device, circuit, or integrated circuit further comprises a transceiver component coupled to an output node of the ADC.

Figure 7:
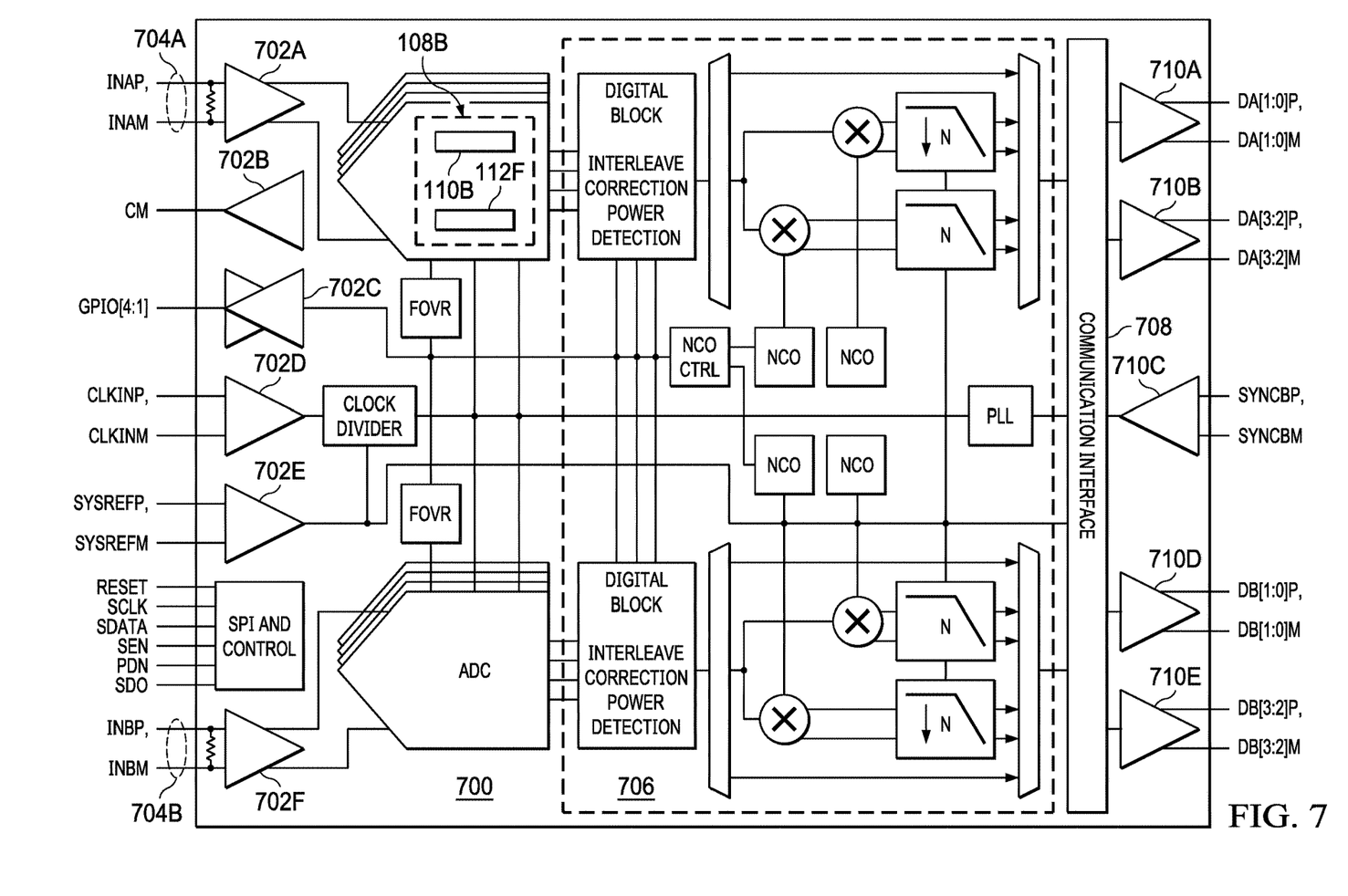
FIG. 7 is a block diagram of an ADC device in accordance with various examples.

FIG. 7 is a block diagram of an ADC device 700 in accordance with various examples. In the example of FIG. 7, the ADC device represents a dual-channel ADC device, where at least one of the channels includes ADC logic 102A a residue amplifier 108B with differential transistors 110B and a linearity adjustment circuit 110F (e.g., the linearity adjustment circuit 112 of FIG. 1, the linearity adjustment circuit 112A of FIG. 2, the linearity adjustment circuit 112B of FIG. 3A, the linearity adjustment circuit 112C of FIG. 4A, the linearity adjustment circuit 112D of FIG. 5, or the linearity adjustment circuit 112E of FIG. 6A. In some examples, the ADC device 700 supports radio frequency (RF) sampling with input frequencies up to 4 Ghz or more. In some examples, the ADC device 700 has a low noise spectral density (on the order of −155 dBFS/Hz) as well as dynamic range and channel isolation over a large input frequency range. As shown, the ADC device 700 includes various buffers 702A-702F to buffer the analog input, where on-chip termination provides uniform input impedance across a wide frequency range and minimizes sample-and-hold glitch energy. Each of the ADC channels 704A and 704B can be connected to a dual-band, digital down-converter (DDC) 706 with up to three independent, 16-bit numerically-controlled oscillators (NCOs) per DDC for phase-coherent frequency hopping. Additionally, the ADC device 700 is equipped with frontend peak and RMS power detectors and alarm functions to support external automatic gain control (AGC) algorithms. At the output of the ADC device 700, a serial interface 708 (e.g., to support a subclass 1-based deterministic latency using data rates up to 12.5 Gbps with up to four lanes per ADC) and output buffers 710A-710E are used.

The ADC device 700 is merely an example and is not intended to limit uses of a residue amplifier with differential transistors and a linearity adjustment circuit as described herein. In different examples, ADC devices vary with regard to the number of ADC channels, the number of output bits, the number of ADC stages, and/or other ADC options. By using residue amplifier with differential transistors and a linearity adjustment circuit as described herein, ADC error resulting from operations of the residue amplifier are reduced compared to other ADC topologies.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A sampling analog-to-digital converter (ADC) circuit, comprising:
   a first ADC stage;
   a residue amplifier coupled to the first ADC stage, wherein the residue amplifier comprises:
      a first transistor with a control terminal, a first current terminal, and a second current terminal;
      a second transistor with a control terminal, a first current terminal, and a second current terminal; and
      a linearity adjustment circuit coupled to a second current terminal of at least one of the first transistor and the second transistor, wherein the linearity adjustment circuit comprises at least one switch that changes its state as a function of an input sampling phase and a gain phase of the residue amplifier;
   wherein the at least one switch comprises:
      a first switch coupled between the second current terminal of the first transistor and a bias voltage; and
      a second switch coupled between the first current terminal of the first transistor and the bias voltage.

2. The sampling ADC circuit of claim 1, further comprising a controller coupled to control terminals of the first and second switches, wherein, during the input sampling phase of the residue amplifier, the controller is configured to turn on the first and second switches to adjust the bias voltage across the first and second current terminals of the first transistor to maintain the first transistor in a depletion region.

3. The sampling ADC circuit of claim 1, wherein the at least one switch comprises a third switch coupled between the first current terminal of the second transistor and the bias voltage.

4. The sampling ADC circuit of claim 3, further comprising a controller coupled to control terminal of the second transistor, wherein, during the input sampling phase of the residue amplifier, the controller is configured to turn on the third switch to apply a bias voltage across the first and second current terminals of the second transistor to maintain the second transistor in a depletion region.

5. A sampling analog-to-digital converter (ADC) circuit, comprising:
   a first ADC stage;
   a residue amplifier coupled to the first ADC stage, wherein the residue amplifier comprises:
      a first transistor with a control terminal, a first current terminal, and a second current terminal;
      a second transistor with a control terminal, a first current terminal, and a second current terminal; and
      a linearity adjustment circuit coupled to a second current terminal of at least one of the first transistor and the second transistor, wherein the linearity adjustment circuit comprises at least one switch that changes its state as a function of an input sampling phase and a gain phase of the residue amplifier;
   wherein the second current terminal of the first transistor is coupled to a first current source, wherein the second current terminal of the second transistor is coupled to a second current source, and wherein the at least one switch comprises a tail switch coupled between the second current terminals of the first and second transistors.

6. The sampling ADC circuit of claim 5, further comprising a controller configured to turn off the tail switch during the input sampling phase of the residue amplifier and to turn on the tail switch during the gain phase of the residue amplifier.

7. A system, comprising:
   a top-plate sampling capacitor; and
   an analog-to-digital converter (ADC) circuit, wherein the ADC circuit comprises:
      a first ADC stage; and
      a residue amplifier coupled to the first ADC stage, wherein the residue amplifier comprises:

a differential pair of transistors comprising:
   a first transistor with a control terminal, a first current terminal, and a second current terminal; and
   a second transistor with a control terminal, a first current terminal, and a second current terminal; and
a linearity adjustment circuit coupled to the differential pair of transistors and configured to bias the differential pair of transistors in a depletion region during an input sampling phase of the residue amplifier.

8. The system of claim 7, wherein the linearity adjustment circuit comprises:
   a first switch coupled between the second current terminal of the first transistor and a bias voltage; and
   a second switch coupled between the first current terminal of the first transistor and the bias voltage.

9. The system claim 8, further comprising a controller coupled to control terminals of the first and second switches, wherein, during the input sampling phase of the residue amplifier, the controller is configured to turn on the first and second switches to apply the bias voltage across the first and second current terminals of the first transistor to maintain the first transistor in the depletion region.

10. The system of claim 9, wherein the ADC circuit is part of an integrated circuit.

11. The system of claim 8, wherein the linearity adjustment circuit comprises a third switch coupled between the second current terminal of the second transistor and the bias voltage.

12. The system of claim 11, further comprising a controller coupled to control terminal of the second transistor, wherein, during the input sampling phase of the residue amplifier, the controller is configured to turn on the third switch to apply a bias voltage across the first and second current terminals of the second transistor to maintain the second transistor in a depletion region.

13. An integrated circuit, comprising:
a sampling input;
an analog-to-digital converter (ADC) circuit coupled to the sampling input node, wherein the ADC circuit comprises:
   a first ADC stage; and
   a residue amplifier coupled to the first ADC stage, wherein the residue amplifier comprises:
      a differential pair of transistors comprising:
         a first transistor with a control terminal, a first current terminal, and a second current terminal; and
         a second transistor with a control terminal, a first current terminal, and a second current terminal; and
      a linearity adjustment circuit coupled to the differential pair of transistors and configured to operate the first and second transistors in a source follower mode during an input sampling phase of the residue amplifier.

14. The integrated circuit of claim 13, wherein the second current terminal of the first transistor is coupled to a first current source, wherein the second current terminal of the second transistor is coupled to a second current source, and wherein the linearity adjustment circuit comprises a tail switch coupled between the second current terminals of the first and second transistors.

15. The integrated circuit of claim 13, further comprising a controller configured to turn off the tail switch during the input sampling phase of the residue amplifier and to turn on the tail switch during the gain phase of the residue amplifier.

16. The integrated circuit of claim 13, wherein the integrated circuit further comprises a transceiver component coupled to an output of the ADC circuit.

* * * * *